(12) United States Patent
Ferrara

(10) Patent No.: US 7,276,712 B2
(45) Date of Patent: Oct. 2, 2007

(54) METHOD AND APPARATUS FOR SCANNING A WORKPIECE IN A VACUUM CHAMBER OF AN ION BEAM IMPLANTER

(75) Inventor: Joseph Ferrara, Georgetown, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 293 days.

(21) Appl. No.: 11/173,494

(22) Filed: Jul. 1, 2005

(65) Prior Publication Data
US 2007/0001129 A1    Jan. 4, 2007

(51) Int. Cl.
H01J 37/20    (2006.01)
(52) U.S. Cl. ............................ 250/492.21; 250/442.11; 250/281; 250/287
(58) Field of Classification Search ............... None
See application file for complete search history.

(56) References Cited
U.S. PATENT DOCUMENTS
4,761,559 A    8/1988    Myron
4,975,586 A    12/1990   Ray
6,710,360 B2   5/2004    Ferrara Primary Examiner—Jack I. Berman
Assistant Examiner—Zia R. Hashmi
(74) Attorney, Agent, or Firm—Tarolli, Sundheim, Covell & Tummino LLP

(57) ABSTRACT

An ion beam implanter includes an ion beam source for generating an ion beam moving along a beam line and an implantation chamber wherein a workpiece is positioned to intersect the ion beam for ion implantation of an implantation surface of the workpiece by the ion beam. The implanter further includes a workpiece support structure coupled to the implantation chamber and supporting the workpiece within an interior region of the implantation chamber, the workpiece support structure. The workpiece support structure includes a rotation member coupled to the implantation chamber for changing an implantation angle of the workpiece with respect to a portion of the ion beam within the implantation chamber. The workpiece support structure also includes a translation member movably coupled to the rotation member and supporting the workpiece for movement along a path of travel wherein at least some components of the translation member components are disposed within a reduced pressure translation member chamber. The translation member chamber is isolated from the implantation chamber interior region by a dynamic seal. A workpiece holder support arm of the translation member extends through the dynamic seal and into the implantation chamber.

29 Claims, 5 Drawing Sheets

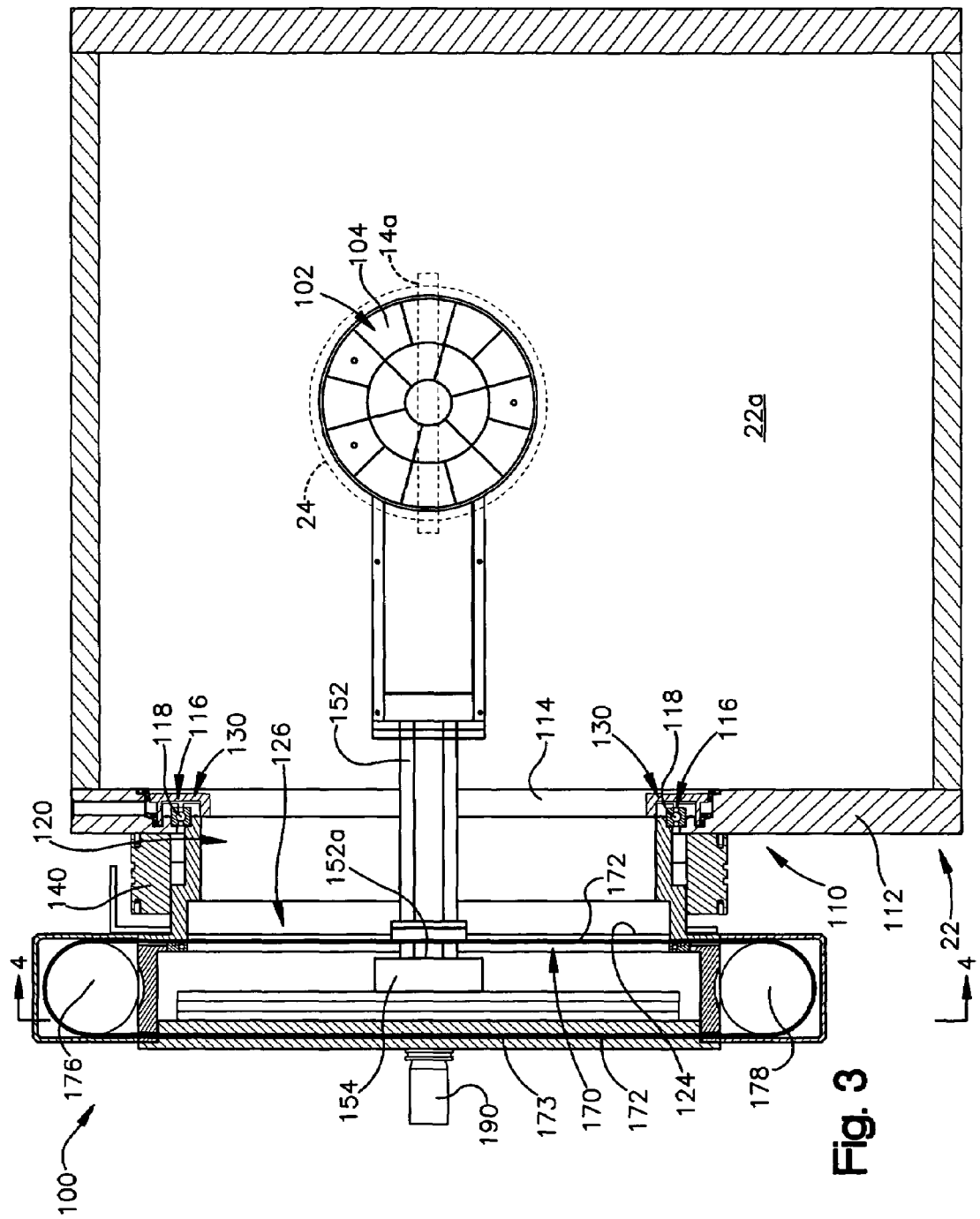

METHOD AND APPARATUS FOR SCANNING A WORKPIECE IN A VACUUM CHAMBER OF AN ION BEAM IMPLANTER

FIELD OF THE INVENTION

The present invention relates to an adjustable implantation angle workpiece support assembly or structure coupled to a process or implantation chamber of an ion beam implanter and, more particularly, to a workpiece support structure wherein drive components of a translation member that provides for linear movement of a workpiece within the implantation chamber are disposed in a reduced pressure chamber that is isolated from the implantation chamber by a dynamic seal.

BACKGROUND ART

Ion beam implanters are widely used in the process of doping workpieces. An ion beam implanter generates an ion beam comprised of desired species of positively charged ions. The ion beam impinges upon an exposed surface of a workpiece such as a semiconductor wafer, substrate or flat panel, thereby "doping" or implanting the workpiece surface with desired ions. Some ion implanters utilize serial implantation wherein a single wafer workpiece is positioned on a support in an implantation chamber and implanted. The implantation occurs one workpiece at a time. The support is oriented such that the workpiece is in front of the ion beam and is scanned to implant a desired dosage of ions. When the implantation is complete, the workpiece is removed from the support and another workpiece is positioned on the support for implantation.

In recent years, the trend in the semiconductor industry has been to use increasingly larger wafer workpieces, for example, 300 mm. diameter wafers. The ability to implant large wafer workpieces or other workpieces such as flat panels serially has become very desirable. One way to implant a workpiece serially is to move it within an evacuated process or implantation chamber in front of a scanned or broad ion beam. U.S. Pat. No. 6,710,360 B2 to Ferrara, assigned to the assignee of the present invention, discloses a workpiece support structure that provides: a rotation member rotatably affixed to process chamber for changing an implantation angle of the workpiece with respect to the ion beam within the process chamber and a translation member movably coupled to the rotation member and supporting the workpiece for linear movement along a path of travel. The translation member moves the workpiece along a direction of movement such that, for any desired implantation angle, a distance traversed by ion beam within the implantation chamber before striking the implantation surface of the workpiece is substantially constant.

One issue with regard to the translation member is that of contamination. If the translation member is housed within or is in fluid communication with the evacuated implantation chamber, dopant and photoresist material dislodged from a workpiece during implantation tend to coat the translation member components causing early failure of the translation member. Of even greater importance are particulates which may be deposited on the workpiece being implanted. If the translation member and associate harnessing are within the implantation chamber or are in fluid communication with the implantation chamber, particulates emitted by these components during linear movement of the translation member may be deposited on the workpiece thereby contaminating it. Since even minute amounts of particulate matter on a workpiece may cause a workpiece to be rejected, workpiece contamination is of paramount importance.

What is desired is a workpiece support structure that effectively isolates the translation member from the implantation chamber evacuated interior region.

SUMMARY OF THE INVENTION

One exemplary embodiment of the present invention concerns an ion beam implanter having a workpiece support structure for supporting a workpiece within a process or implantation chamber. The ion beam implanter includes an ion beam source for generating an ion beam moving along a path of travel. The workpiece is supported by the workpiece support structure within an evacuated interior region of the implantation chamber such that the workpiece is positioned to intersect the path of travel of the ion beam for implantation of a implantation surface of the workpiece.

The workpiece support structure is coupled to the implantation chamber and supports the workpiece. The workpiece support structure includes a rotation member rotatably coupled to the implantation chamber, the rotation member having an axis of rotation perpendicular to a path of the ion beam within the implantation chamber. Rotation of the rotation member changes an implantation tilt angle of the workpiece with respect to the path of the ion beam in the implantation chamber. The workpiece support structure further includes a translation member movably coupled to the rotation member and supporting the workpiece for linear movement along a path of travel in a direction transverse to the ion beam while maintaining the selected implantation angle. At least some of the translation member components are disposed within a reduced pressure chamber that is isolated from the implantation chamber interior region by a conductance limiting dynamic seal.

The dynamic seal comprises a thin shield that overlies an opening in a hub of the rotation member and is affixed to and moves with a workpiece holder support arm that extends through the hub opening and into the implantation chamber interior region. Surrounding the hub opening is a static face seal. The movable shield and the static face seal establish the dynamic seal. The pressure in the reduced pressure chamber is maintained at a lower pressure than the implantation chamber. This further minimizes the possibility of particles from the translation member components within the reduced pressure chamber migrating into the implantation chamber interior region. Advantageously, the dynamic seal does not require complete, positive contact between the shield and the static face seal to function properly. A small gap between the shield and static face shield can be tolerated so long as the gap is sufficiently small that the dynamic seal still results in a large impedance for gas flow and particle movement between the reduced pressure chamber and the implantation chamber interior region.

Disposed at a distal end of the workpiece holder support arm is an electrostatic chuck that supports the workpiece during implantation. Utilities for the electrostatic chuck are routed via a harness through an interior of the support arm to the electrostatic chuck.

Maintaining the translation member in a reduced pressure chamber that is isolated from the implantation chamber interior region advantageously reduces particulates from the translation member from migrating into the implantation chamber interior region. Additionally, maintaining the translation member reduced pressure chamber at a lower pressure than the implantation chamber reduces dopants and photoresist materials from coating the translation member components.

These and other objects, advantages, and features of the exemplary embodiment of the invention are described in detail in conjunction with the accompanying drawings.

BRIEF DESCRIPTION OF THE DRAWINGS

FIG. 3 is a schematic sectional view of the implantation chamber of FIG. 2 as seen from a plane indicated by the line 3-3 in FIG. 2;

DETAILED DESCRIPTION

Overview

Figure 1:
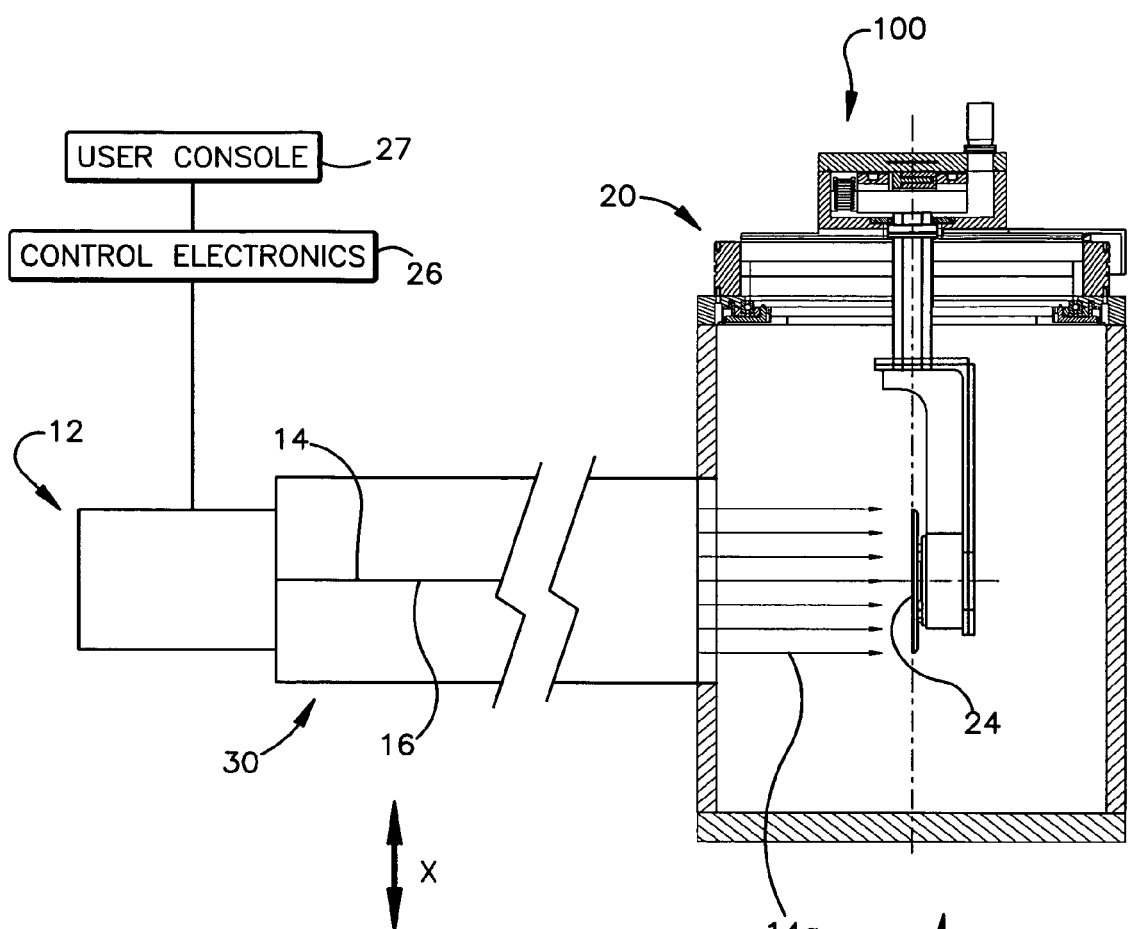
FIG. 1 is a schematic plan view of an ion beam implanter of the present invention.

Turning to the drawings, an ion beam implanter is shown generally at 10 in FIG. 1. The implanter includes an ion source 12 for creating ions which are formed into an ion beam 14 by beam shaping apparatus 30. The ion beam 14 traverses a beam path 16 to an end or implantation station 20. The implantation station includes a process implantation chamber 22 defining an interior region 22a maintained at reduced pressure in which a workpiece 24 such as a semiconductor wafer or a flat panel or a substrate is positioned for implantation by the ion beam 14. Control electronics (shown schematically at 26) are provided for monitoring and controlling the ion dosage received by the workpiece 24. Operator input to the control electronics 26 are performed via a user console 27.

The ion beam 14 enters the implantation chamber 22 through an opening 22b in a front wall 22c of the chamber 22. Within the implantation chamber 22, the ion beam 14 is a ribbon ion beam 14a that essentially has the shape of a very narrow rectangle that is, a beam that extends in one direction, e.g., has a horizontal or x direction extent (shown as W in FIG. 2) with very limited extent in the orthogonal direction, e.g., in the vertical or y direction.

Generally, the extent of the ribbon ion beam 14a is sufficient to implant the entire corresponding dimension of the workpiece 24, that is, if the ribbon ion beam 14a traversing the implantation chamber 22 extends in the horizontal or x direction (FIG. 1) and the workpiece 24 has a horizontal dimension of 300 mm. (or a diameter of 300 mm.).

A more detailed description of an ion implanter adapted for serial implantation of workpieces is disclosed in U.S. Pat. No. 4,975,586, issued to Ray et al. on Dec. 4, 1990 and U.S. Pat. No. 4,761,559, issued to Myron on Aug. 2, 1988. The '586 and '599 patents are assigned to the assignee of the present invention and are incorporated herein in their respective entireties by reference.

The implantation chamber interior region 22a is evacuated. A wafer handling system 32 within the implantation chamber 22 automatically loads and unloads wafer workpieces to and from an electrostatic clamp or chuck 102. The electrostatic chuck 102, which is part of a workpiece support structure 100, is energized to hold the workpiece 24 in place during implantation. Prior to implantation, the workpiece support structure 100 rotates the workpiece 24 to a vertical or near vertical position for implantation, as shown in FIG. 1. If the workpiece 24 is vertical, that is, normal with respect to the ion beam 14, the implantation angle (IA) or angle of incidence is 0 degrees.

Workpiece Support Structure 100

The workpiece support structure 100 is operated by the control electronics 26, supports the workpiece 24 during implantation, and, advantageously, permits both rotational and translational movement of the workpiece 24 with respect to the ribbon ion beam 14a within the implantation chamber 22. By virtue of its rotational capability, the workpiece support structure 100 advantageously permits selection of a desired implantation angle or angle of incidence between the ion beam 14 and an implantation surface 25 of the workpiece 24.

By virtue of its translational or linear movement capability, the workpiece support structure 100 permits the implantation surface of the workpiece 24 to be moved along a plane coincident with the desired implantation angle during implantation thereby both maintaining the desired implantation angle and additionally keeping substantially constant a distance d (FIG. 2) that the ribbon ion beam 14a travels from its entry into the implantation chamber interior region 22a to the point (actually a line because the ion beam is a ribbon ion beam) where it impacts the implantation surface 25 of the workpiece 24. This substantially constant distance is maintained during the during entire implantation of the implantation surface 25. That is, the substantially constant distance is maintained as the workpiece 25 moves transversely with respect to the ribbon ion beam 14a, in a plane coincident with the desired implantation angle such that the entire implantation surface 25 is implanted from one end 25a of the implantation surface 25 to the opposite end 25b (FIG. 3).

During a production run, semiconductor wafer workpieces or flat panel workpieces are serially implanted. That is, when one workpiece's implantation is completed, the electrostatic clamp 102 is denergized to release the workpiece and implanted workpiece is automatically removed from the implantation chamber 22 and another workpiece is positioned on a support surface 104 the electrostatic clamp 102 and the clamp is suitably energized to securely hold the workpiece 24 on the support surface 104.

Rotation Member 110

Figure 2:
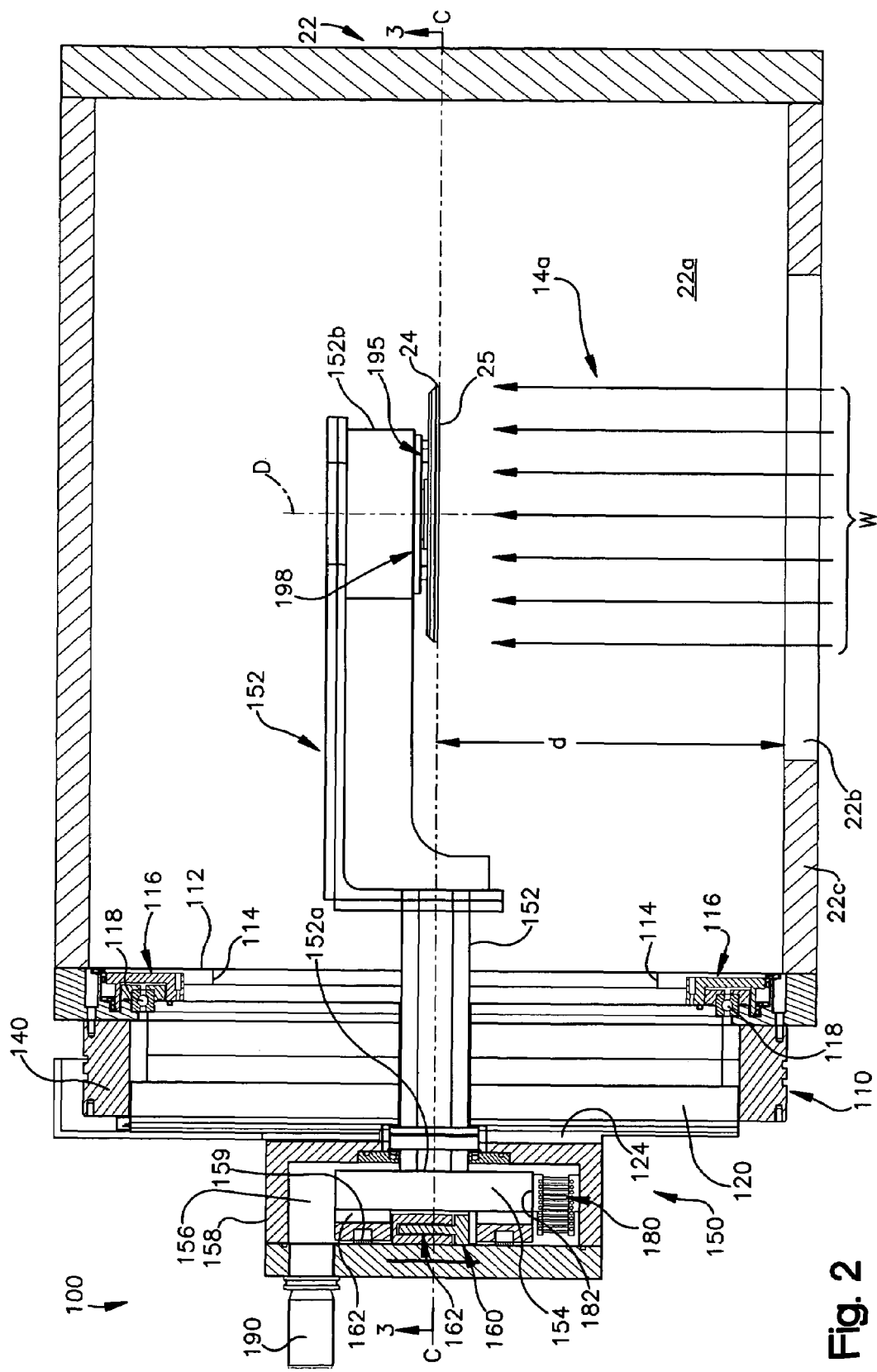
FIG. 2 is a schematic view, partially in top plan view and partially in section, of a process or implantation chamber and associated workpiece support structure of the ion beam implanter of FIG. 1.
Figure 2A:
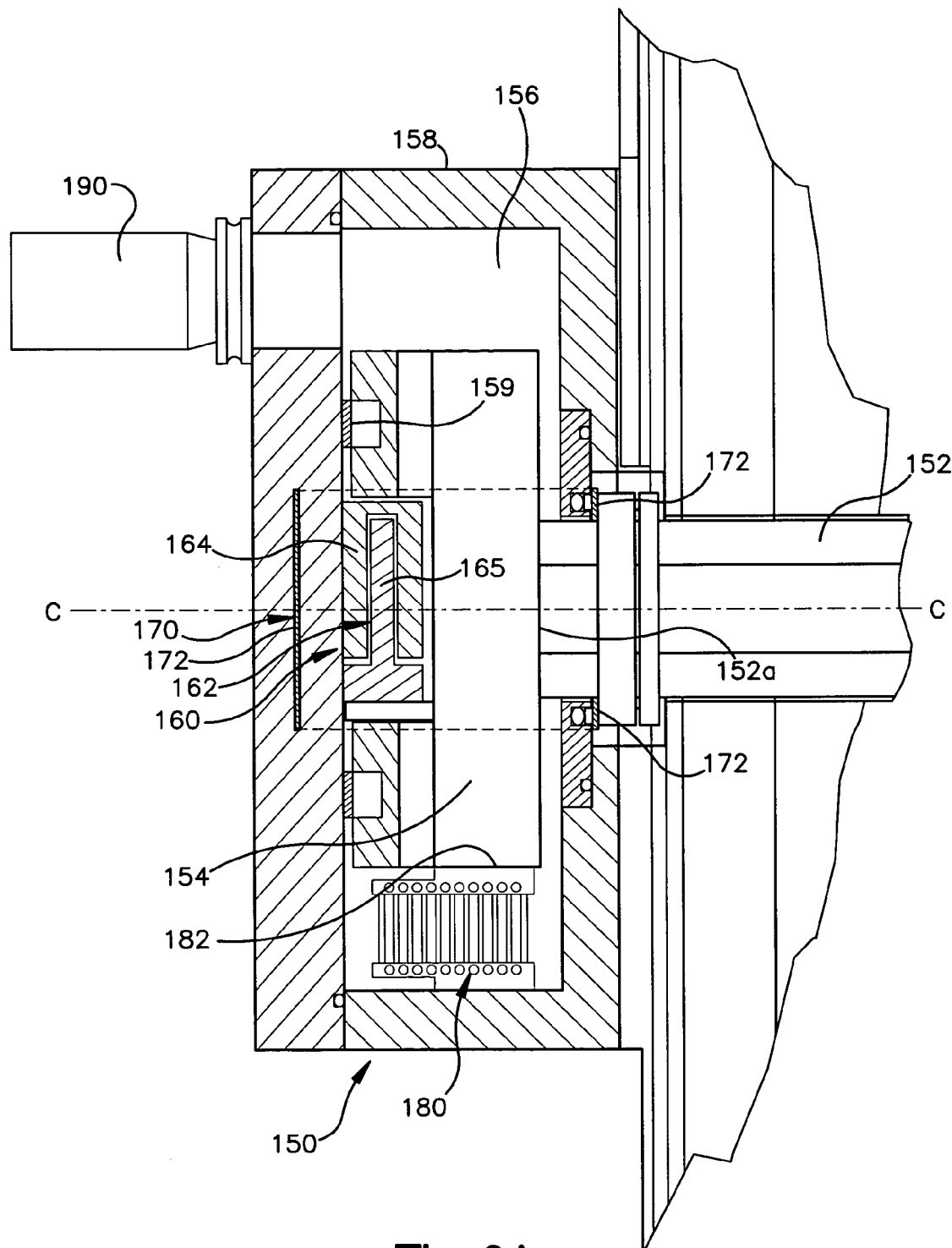
FIG. 2A is an enlarged schematic view of a portion of FIG. 2.
Figure 4:
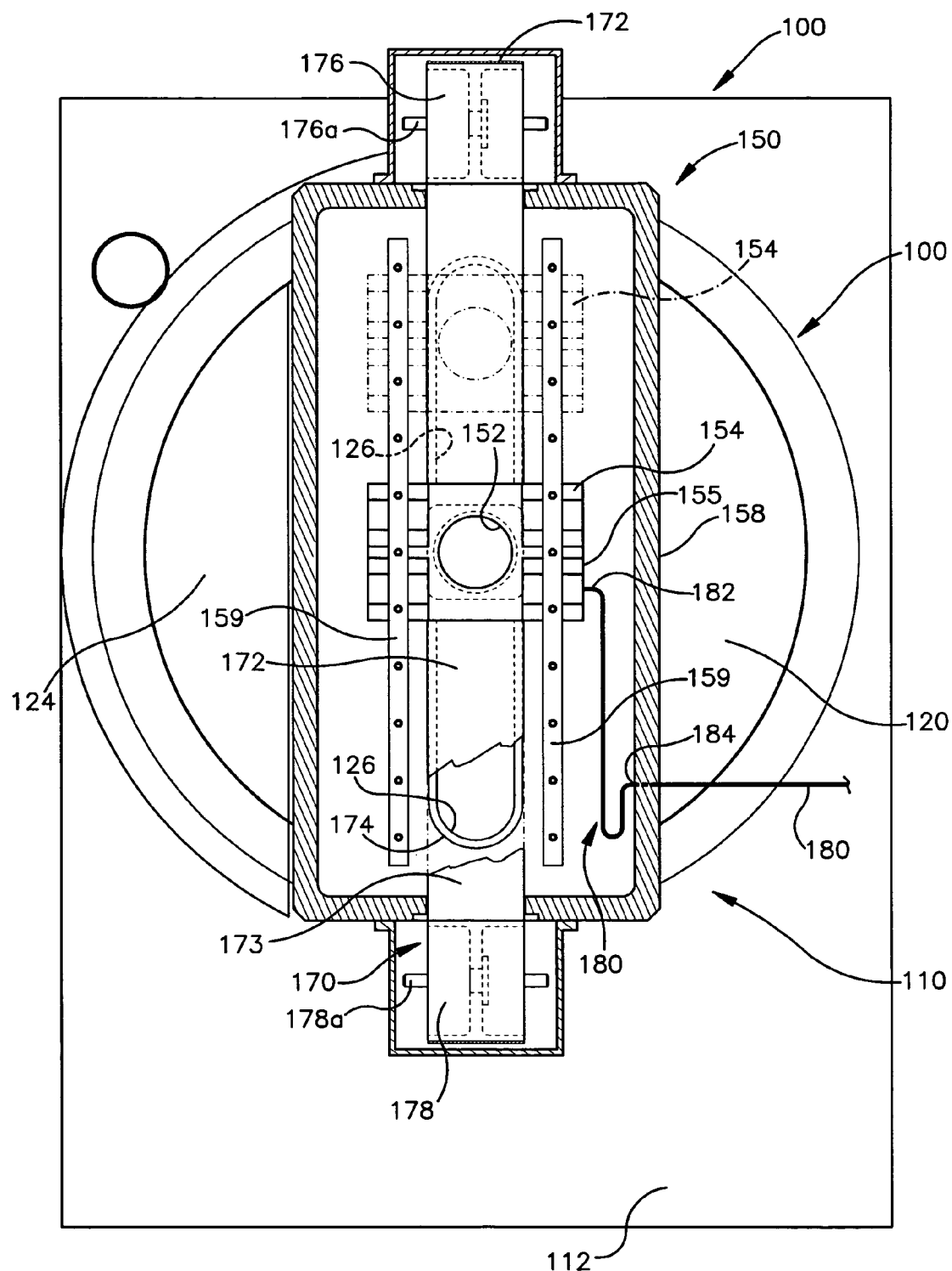
FIG. 4 is a schematic sectional view of the implantation chamber of FIG. 2 as seen from a plane indicated by the line 4-4 in FIG. 3.

As can best be seen in FIGS. 2-4, the workpiece support assembly or structure 100 is affixed to the implantation chamber 22 and extends into the interior region 22a of the implantation chamber 22. A side wall of the implantation chamber 22 is open and the workpiece support structure 100 overlies the open side wall, effectively closing the chamber 22. The workpiece support structure 100 includes a rotation member 110 and an integral translation member 150. The workpiece support structure rotation member 110 includes a stationary support plate 112 which is affixed to the open side of the implantation chamber 22. The support plate 112 includes an opening 114 through with a workpiece holder support arm 152 extends into the chamber interior region 22a.

The rotation member 110 also includes a hub 120 which is rotatably coupled to the implantation chamber 22 and, more specifically, is rotatably coupled to the support plate 112 of the rotation member 110. The hub 120 is attached to the support plate 112 by means of a circular bearing assembly 116. In one preferred embodiment, the bearing assembly 116 is a ball or roller bearing assembly. The bearing assembly 116 is a circular bearing assembly including a plurality of ball or roller bearings 118 supported in a circular bearing cage. The bearing cage being disposed between disposed between and inner and outer races to provide for rotation of the hub 120 with respect to the support plate 112 and, therefore, the implantation chamber 22. Other mechanical ball or roller bearing assemblies known to those of skill in the art may be utilized. Alternately, instead of a mechanical bearing assembly, a non-contact gas bearing could be suitably employed, as would be recognized by one of ordinary skill in the art.

The interior region 22a of the implantation chamber 22 is evacuated during implantation. Therefore, a vacuum seal must be maintained between the stationary support plate 112 and the rotating hub 120. In one preferred embodiment, the vacuum seal is achieved by a circular seal system 130 comprising a contact type of seal such as an o-ring, lip seal or other polymer material seal design. The o-ring of the circular seal system 130 may be disposed in a circular groove in the support plate 112 in the region where the rotating hub 120 and the support plate are in mating proximity. As would be recognized by one of ordinary skill in the art, other seal systems such as a differentially pumped circular contact vacuum seal system, as described in U.S. Pat. No. 6,710,360 to Ferrara and assigned to the assignee of the present invention may also be utilized. The '360 is incorporated herein in its entirety by reference. Additionally, non-contact vacuum seal systems would also be suitable as a circular vacuum seal system. In a non-contact vacuum seal system, O-rings and plastic seals are not utilized. Instead one or more circular channels would be machined in a mating surface of the support plate 112. The channels would be in fluid communication with vacuum pump coupled to the support plate 112. The vacuum pump would be operated to draw a vacuum in the circular channels.

Rotation of the hub 120 with respect to the support plate 112 and implantation chamber 22 is preferably achieved by use of a direct drive electrical motor 140. The hub 110 is coupled to the rotor of the electric motor 140. It should be understood that other drive mechanisms may be employed to rotate the hub 120 such as a circular track linear motor such at the one described in the aforementioned '360 patent. The rotation member 110 allows for, rotation of the workpiece 24 inside the implantation chamber 22 with respect to the ribbon ion beam 14a. The centerline C-C (shown in dashed line in FIG. 2) of the rotation member 110 is aligned with the front of the workpiece implantation surface 25.

Translation Member 150

The workpiece support structure 100 further includes the translation or reciprocating member 150 which is integral with the rotation member 110. As can best be seen in FIG. 2, the translation member 150 includes a linear scanning member 154 that is supported for linear movement within a reduced pressure chamber 156 defined by translation member housing 158. The translation member housing 158 is attached to a side wall 124 of the rotation member hub 120. The linear scanning member 154 coupled to a support frame 164 via a linear bearing system 159 and is driven along a linear path of travel with respect the support frame 164 by a linear drive system 160. The linear bearing assembly 159 may be a mechanical bearing system such as a ball or roller bearing system. Alternatively, the bearing system 159 may be a non-contact gas bearing.

In one preferred embodiment, the linear drive system 160 comprises a linear motor system. The linear drive system 160 comprises a linear servomotor 162 disposed between the movable linear scanning member 154 and the stationary support frame 164. The linear servomotor 162 comprises a set of electromagnetic coils arranged linearly along the support frame 164 and a set of permanent magnets arranged in linear fashion on track plates 165 in proximity to and opposing the set of electromagnetic coils. The electromagnetic coils are appropriately energized by the control electronics 26 to precisely control linear movement of the scanning member 154 and thereby the workpiece 24 with respect to the ion beam. Alternately, the linear drive system may comprise a ballscrew drive system.

The reciprocating linear motion of the scanning member 154 during implantation is perpendicular to a normal vector of the workpiece implantation surface 25. Stated another way, linear movement of the scanning member 154 causes movement of the workpiece 24 within a plane coincident with the selected implantation angle. Multiple independent degrees of freedom or motion are advantageously achieved by combination of the reciprocating linear motion of the translation member 150 within the rotational member 110. This allows for constant focal length scanning of the workpiece 24 in front of the ion beam 14. In other words, a distance from the impact point of the ion beam on the workpiece implantation surface 25 to the ion beam 14 entrance into the implantation chamber 22 is always constant for all rotation angles, that is, all implantation angles.

Dynamic Seal 170

One end 152a of the workpiece holder support arm 152 is affixed to the linear scanning member 154. As can best be seen in FIG. 3, the workpiece holder support arm 152 extends through a conductance limiting dynamic sliding seal 170 and into the implantation chamber interior region 22a. The translation member 150 provides for linear translational movement of the workpiece 24 along a plane coincident with the selected implantation angle. As can best be seen in FIG. 2, the workpiece holder support arm 152 extends orthogonally from the scanning member 154. The workpiece holder support arm 152 terminates in an opposite end 152b which supports the electrostatic clamp 102. The electrostatic clamp 102 rotatably supports the workpiece 24 for implantation by the ribbon ion beam. 14a.

The dynamic seal 170 overlies an oval-shaped opening 126 through the hub 120. The dynamic seal 160 seals and isolates the translation member chamber 156 from the implantation chamber interior region 22a. As the linear scanning member 154 moves along its path of travel, the workpiece 24 is moved in the path of the ion beam 14a to provide complete implantation of the workpiece implantation surface 25.

The dynamic seal 170 includes a moving shield 172 which overlies and seals against a static seal 174 forming a high impedance barrier to gas and particulate flow. The static seal 174 may be an oval shaped high density polymer seal disposed in a groove formed in an outwardly facing side wall 124 of the hub 120. In one preferred embodiment, the shield 172 comprises an endless belt 173 of high strength stainless steel mounted on a pair of pulleys 176, 178 that allow for movement of a portion of the belt adjacent to the hub 120 to move with the linear scanning member 154 and the workpiece holder support arm 152. The pulleys 176, 178 are mounted on bearings 176a, 178a (FIG. 4). The stainless steel belt 173 advantageously requires no lubrication, is substantially nonstretchable and creates very few particulates when moved. A suitable belt 173 is manufactured by Belt Technologies, Inc., Agawam, Mass. (www.belttechnologies.com).

Since the purpose of the dynamic shield is to provide a high impedance seal or barrier to gas and particulate flow between the translation member chamber 156 and the implantation chamber interior region 22a when the linear scanning member 154 is stationary or moving. While the shield 172 may physically contact or touch the seal 174 to form the seal or barrier, it should be understood that the seal or barrier may be achieved without actual physical contact between the shield 172 and the seal 174. A physical gap between the shield 172 and seal 174 is permissible provided that the gap is small enough that a high impedance barrier or seal between the translation member chamber 156 and implantation chamber interior region is achieved. Indeed, providing a small gap (e.g., on the order of 0.001") between the shield 172 and the seal 174 advantageously avoids generation of particulate matter that may occur with physical contact of the shield and seal resulting from rubbing of the shield on the seal as the linear scanning member 154 moves up and down.

A reduced pressure is maintained in the translation member chamber 156 by a small vacuum pump 190 affixed to the translation member housing 158. Advantageously, the components of the translation member 150 including the linear scanning member 154, the support frame 164, a harness system 180 (described below) and a portion of the workpiece holder support arm 152 are maintained in the translation member chamber 156 in isolation from the implantation chamber interior region 22e. This reduces the possibility of particulates from the translation member 150 from contaminating the workpiece 24. In one embodiment, during implantation, the translation member chamber 156 is maintained at a pressure which is lower than a pressure in the implantation chamber interior region 22e. This advantageously further isolates and reduces the processing materials such as doping material and photoresist material from entering the translation member chamber 156 and coating the translation member components.

Linear Motion Harness System 180

A linear motion harness system 180 is provided within the translation member chamber 156 to route facilities to the electrostatic chuck 102 and the linear drive system 160. An end 182 of the harness system 180 is connected via vacuum feedthroughs in a side wall 155 of the scanning member 154 to an interior region of the scanning member. An opposite end 184 of the harness system 180 extends through vacuum feedthroughs in the translation member housing 158 to the external environment. The interior region of the scanning member 154 is in fluid communication with an interior region of the workpiece support arm 152. Thus, electrical and cooling lines such as motor power lines, encoder readback signal lines, control signal lines, and water and gas cooling lines are routed from the exterior through the harness system 180 through adjoining interior the scanning member 154 and the workpiece support 152 to the electrostatic chuck 102. Use of the harness 180 permits the interior areas of the scanning member and workpiece support to be maintained at atmospheric pressure.

Electrostatic Chuck 102

The workpiece 24 is held with respect to the workpiece holder support arm 152 by means of the electrostatic clamp or chuck 102. The electrostatic chuck 102 is cooled in order to remove the energy or heat that is transferred from the workpiece 24 during implantation. In order to allow for quad or octal implants, preferably, the electrostatic clamp 102 is operatively coupled to a motor so that the workpiece support surface 104 of the clamp 102 can rotate 360 degrees. The rotational centerline of the electrostatic clamp 102, shown as dashed line D in FIG. 2, is aligned with a centerline of the workpiece 24. The electrostatic clamp 102 rotation is achieved by means of an electric motor (not shown) that is mounted within the workpiece holder distal end 152b and connected to the electrostatic clamp 102 by a suitable drive means such as a belt or cable (not shown) or, alternatively, the electric motor may be directly coupled to the electrostatic clamp 102. The electrostatic chuck 102 is mounted to the workpiece holder distal end 152b by means of a bearing assembly 195. The bearing assembly 195 is preferably a ball or roller bearing assembly. The bearing assembly 195 preferably comprises ball or roller bearings supported within a bearing cage and disposed between and arcuate inner and outer races affixed to or formed in the corresponding surfaces of the workpiece holder distal end 152b and the reverse side of the electrostatic clamp 102. Alternately, the bearing assembly 195 may be a non-contact gas bearing.

A vacuum between the electrostatic clamp 102 and workpiece holder distal end 152b is maintained by means of a vacuum seal system or assembly 198. The vacuum seal system 198 is needed because the interior regions of the workpiece holder support arm 152 and scanning member 154 are both at atmospheric pressure. In one preferred embodiment the vacuum seal system 198 is a contract seal system utilizing an o-ring, lip seal or other polymer material seal. Alternately, the seal system 198 may be a non-contact seal systems such as a differentially pumped radial vacuum seal system or a ferrofluidic seal.

While the present invention has been described with a degree of particularity, it is the intent that the invention include all modifications and alterations from the disclosed design falling with the spirit or scope of the appended claims.

I claim:

1. An ion beam implanter comprising:
   a) an ion beam source for generating an ion beam moving along a beam line;
   b) an implantation chamber wherein a workpiece is positioned to intersect the ion beam for ion implantation of an implantation surface of the workpiece by the ion beam; and
   c) workpiece support structure coupled to the implantation chamber and supporting the workpiece within an interior region of the implantation chamber, the workpiece support structure including:
      1) a rotation member coupled to the implantation chamber for changing an implantation angle of the workpiece with respect to a portion of the ion beam within the implantation chamber; and
      2) a translation member movably coupled to the rotation member and supporting the workpiece within the implantation chamber interior region for movement along a path of travel wherein at least some components of the translation member are disposed within a reduced pressure translation member chamber that is isolated from the implantation chamber interior region by a dynamic seal.

2. The ion beam implanter of claim 1 wherein the dynamic seal comprises a thin shield overlying an opening in a hub of the rotation member, the shield being affixed to and moving with a workpiece holder support arm that extends through the hub opening and into the implantation chamber interior region.

3. The ion beam implanter of claim 2 wherein the dynamic seal further includes a static face seal surrounding the hub opening, the shield overlying the static face seal to seal the implantation chamber interior region from the reduced pressure translation member chamber.

4. The ion beam implanter of claim 3 wherein the shield overlying the static face seal is in contact with the shield over at least a portion of static face seal.

5. The ion beam implanter of claim 3 wherein a gap exists between the shield and the overlying static face seal creating a high impedance barrier to gas flow between the reduced pressure translation member chamber and the implantation chamber interior region.

6. The ion beam implanter of claim 2 wherein the thin shield comprises a flexible endless loop that is movably supported on a pulley assembly.

7. The ion beam implanter of claim 2 wherein the thin shield comprises high tensile strength stainless steel.

8. The ion beam implanter of claim 3 wherein the static face seal is an oval shaped high density polymer seal disposed in a groove in an outward facing surface of the hub.

9. The ion beam implanter of claim 1 wherein the reduced pressure translation member chamber is maintained as a lower pressure than a pressure in the implantation chamber interior region during implantation.

10. The ion beam implanter of claim 1 wherein the rotation member has an axis of rotation perpendicular to the portion of the ion beam within the implantation chamber.

11. The ion beam implanter of claim 1 wherein the path of travel of the workpiece is a linear path of travel.

12. The ion beam implanter of claim 1 wherein movement of the translation member is perpendicular to the axis of rotation of the rotation member and parallel to the implantation surface of the workpiece.

13. The ion beam implanter of claim 1 wherein the translation member includes a translation shaft mounted inside the rotation member and having a direction of movement that intersects the axis of rotation of the rotation member.

14. The ion beam implanter of claim 13 wherein the translation member further includes a workpiece holder support arm extending inside the implantation chamber interior region and comprising an electrostatic clamp for holding the workpiece.

15. The ion beam implanter of claim 14 wherein the electrostatic clamp is rotatable with respect to the ion beam.

16. The ion beam implanter of claim 1 wherein the rotating member is coupled to a support plate by a bearing assembly, the support plate being affixed to the implantation chamber.

17. The ion beam implanter of claim 1 wherein a vacuum is maintained between the implantation chamber interior region and the rotating member by a circular vacuum seal.

18. The ion beam implanter of claim 1 wherein the translation member is integral with the rotation member.

19. A workpiece support assembly for an ion beam implanter generating an ion beam moving along a beam line and including an implantation chamber having an interior region wherein a workpiece is positioned to intersect the ion beam for ion implantation of an implantation surface of the workpiece by the ion beam, the workpiece support assembly comprising:

a) a rotation member coupled to the implantation chamber for changing an implantation angle of the workpiece with respect to a portion of the ion beam within the implantation chamber; and b) a translation member movably coupled to the rotation member and supporting the workpiece within the implantation chamber interior region for movement along a path of travel wherein at least some components of the translation member are disposed within a reduced pressure translation member chamber that is isolated from the implantation chamber interior region by a dynamic seal.

20. The workpiece support assembly of claim 19 wherein the dynamic seal comprises a thin shield overlying an opening in a hub of the rotation member, the shield being affixed to and moving with a workpiece holder support arm that extends through the hub opening and into the implantation chamber interior region.

21. The workpiece support assembly of claim 20 wherein the dynamic seal further includes a static face seal surrounding the hub opening, the shield overlying the static face seal to seal the implantation chamber interior region from the reduced pressure translation member chamber.

22. The workpiece support assembly of claim 21 wherein the shield overlying the static face seal is in contact with the shield over at least a portion of static face seal.

23. The workpiece support assembly of claim 21 wherein a gap exists between the shield and the overlying static face seal creating a high impedance barrier to gas flow between the reduced pressure translation member chamber and the implantation chamber interior region.

24. The workpiece support assembly of claim 20 wherein the thin shield comprises a flexible endless loop that is movably supported on a pulley assembly.

25. The workpiece support assembly of claim 20 wherein the thin shield comprises high tensile strength stainless steel.

26. The workpiece support assembly of claim 21 wherein the static face seal is an oval shaped high density polymer seal disposed in a groove in an outward facing surface of the hub.

27. The workpiece support assembly of claim 21 wherein the reduced pressure translation member chamber is maintained as a lower pressure than a pressure in the implantation chamber interior region during implantation.

28. A method of implanting ions in a workpiece using an ion beam implanter generating an ion beam for implanting a workpiece and having an implantation chamber wherein a workpiece is positioned to intersect the ion beam for ion implantation of an implantation surface of the workpiece, the steps of the method comprising:

a) providing a workpiece support structure coupled to the implantation chamber and supporting the workpiece, the workpiece support structure including:

1) a rotation member coupled to the implantation chamber for changing an implantation angle of the workpiece with respect to a portion of a beam line of the ion beam within the implantation chamber; and 2) a translation member movably coupled to the rotation member and supporting the workpiece within the implantation chamber interior region for movement along a path of travel wherein at least some components of the translation member are disposed within a reduced pressure translation member chamber that is isolated from the implantation chamber interior region by a dynamic seal;

b) positioning the workpiece on the translation member;
c) selecting a desired implantation angle for the workpiece by rotating the rotation member;
d) directing the ion beam at the workpiece; and
e) moving the workpiece along a path of travel by moving the translation member such that movement of the translation member maintains a constant distance that the ion beam moves through the implantation chamber before striking the implantation surface of the workpiece.

29. The method of implanting ions in a workpiece of claim 28 wherein, during implantation, the reduced pressure translation member chamber is maintained as a lower pressure than a pressure in the implantation chamber interior region.

* * * * *